United States Patent [19]
Patel

[11] Patent Number: 5,805,641
[45] Date of Patent: Sep. 8, 1998

[54] THRESHOLD SETTING DEVICE

[75] Inventor: Bipinchandra Lalbhai Patel, Harlow, United Kingdom

[73] Assignee: Northern Telecom Limited, Montreal, Canada

[21] Appl. No.: 540,051

[22] Filed: Oct. 6, 1995

[30]     Foreign Application Priority Data

Oct. 7, 1994 [GB] United Kingdom ............... 9420269

[51] Int. Cl.[6] ............... H04L 25/06; H04L 25/10
[52] U.S. Cl. ............................. 375/317; 359/194
[58] Field of Search ....................... 375/317, 345, 375/316; 455/232.1; 327/53, 66, 68, 103; 328/168; 359/194, 189

[56]     References Cited

FOREIGN PATENT DOCUMENTS

WO 92/13401   8/1992   WIPO .

*Primary Examiner*—Tesfaldet Bocure
*Attorney, Agent, or Firm*—Lee, Mann, Smith, McWilliams, Sweeney & Ohlson

[57]     ABSTRACT

An input digital signal developed by a signal source e.g. a photodiode is time-averaged and mirrored by a current mirror to generate one or more decision thresholds. The thresholds may be a set or variable fraction of the average current and track any variation in the average current. This obviates the need for limiting or AGC amplifiers that would otherwise be necessary to maintain the input signal level constant if the thresholds were fixed.

7 Claims, 3 Drawing Sheets

THRESHOLD SETTING DEVICE

This invention relates to digital communications and in particular to decision-making receiver equipment used in digital communications systems.

BACKGROUND OF THE INVENTION

In digital communications systems data is represented as binary digits and transmitted as a signal which may take two or more discrete levels. During transmission noise and sources of interference may be added to the signal in addition to a general smoothing which occurs due to bandwidth limitations of the channel along which the signal passes. At a receiver the transmitted data is retrieved by comparing the received signal with one or more decision thresholds, the thresholds representing boundaries between two levels. Those signals below the threshold are taken as a first logic level e.g. ZERO and those above the threshold as a second logic level e.g. ONE. It is important that the relationship between the decision thresholds and the level of the received signal is correct if the data is to be correctly decoded at the receiver.

The decision thresholds in receivers are commonly fixed to particular values. Providing that the range of the received signal remains relatively stable, this causes few problems. However, the received signal may vary quite considerably because of changes in the corresponding transmitter or in the communications path between the transmitter and receiver with the result that the signal is incorrectly decoded at the receiver.

The conventional approach to avoid errors due to a varying received signal is to use a limiting or AGC amplifier prior to thresholding to ensure that the signal arrives at the decision threshold circuit at the correct level. At high bit rates, particularly in optical communication systems where the bit rates may be in the range of tens of Gbit/s, it is difficult to provide such an amplifier. In particular there are problems with circuit parasitics and in providing a flat response at such high frequencies.

It is known to vary the level of a decision threshold to compensate for the effects of changing circuit conditions on an input signal level. In devices known as adaptive receivers the level of a decision threshold is varied by means of a feedback loop. The outputs of monitoring circuits, each with a decision threshold set each side of the main decision threshold level, are compared; should one of the monitoring circuits report a higher value than the other then the main threshold value is changed accordingly. Adaptive receivers are commonly used to compensate for changes in circuit component values used within a digital communications receiver, for example due to ageing.

It is an object of the present invention to provide improved decision-making equipment.

SUMMARY OF THE INVENTION

According to the present invention there is provided a decision threshold setting circuit which receives an input digital signal and sets one or more decision thresholds, the circuit including means for generating a current corresponding to a time-average level of the input digital signal and means for mirroring said current to generate the decision thresholds, whereby to adjust each decision threshold to a level corresponding to a predetermined fraction of said current.

The present invention copes with a varying input signal without the need for accurate and expensive amplifiers before detection. Indeed, the invention may help to eliminate the need for a limiting or AGC amplifier altogether.

BRIEF DESCRIPTION OF THE DRAWINGS

Embodiments of the invention will now be described with reference to the accompanying drawings in which.

DESCRIPTION OF PREFERRED EMBODIMENTS

Figure 1A:
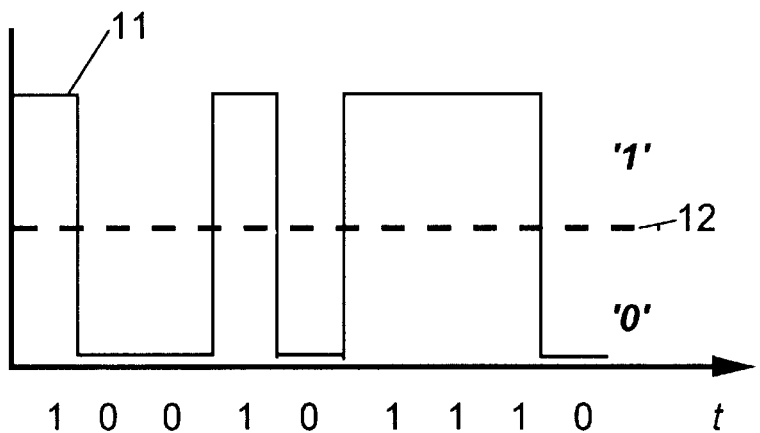
FIGS. 1A and 1B show wave forms of a conventional thresholding system.

Referring to FIG. 1A there is shown an idealised digital wave form 11 of the kind that would be detected by a receiver after transmission over a channel. In practise, the signal would be smoothed by the channel and degraded by noise. In a conventional receiver there will be a fixed decision threshold 12 which is used by the receiver to decide whether the signal at any particular time is representing a "1" or "0". The correctly decoded data is shown beneath the signal. Only one threshold has been shown but there may of course be more than one threshold, for example there may be three thresholds separating the digital levels "00","01", "10" and "11".

Figure 1B:
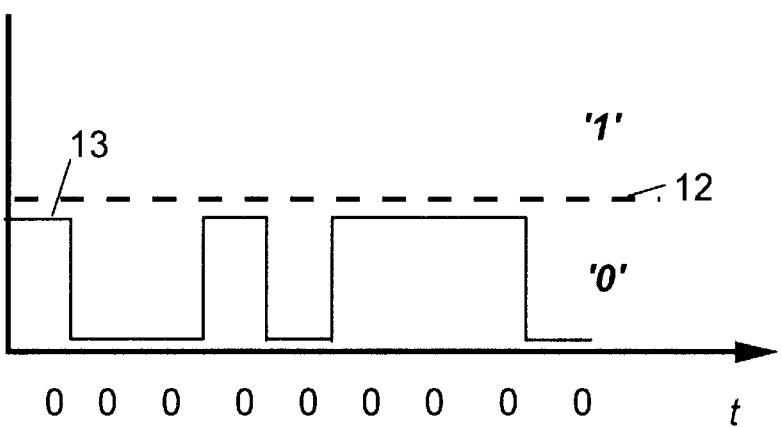

FIG. 1B shows an extreme case where the level of the input signal 13 is reduced; this may be due to the failure of an amplifier or some other component in the transmission path. Because the signal remains below threshold 12 it is incorrectly decoded as a train of zeros.

Figure 1C:
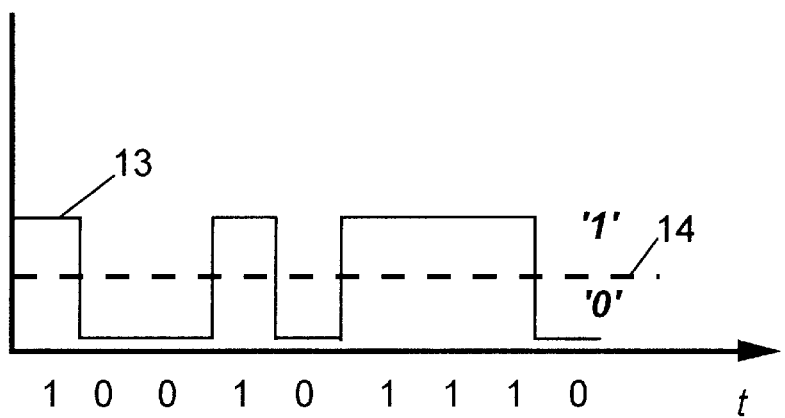
FIG. 1C shows a wave form of a system according to the present invention.

FIG. 1C now shows the effect of a variable threshold according to the invention. The input signal 13, as in FIG. 1B, is at a reduced amplitude but the decision threshold has reduced in proportion to the input signal to ensure that the digital data is correctly decoded.

Figure 2:
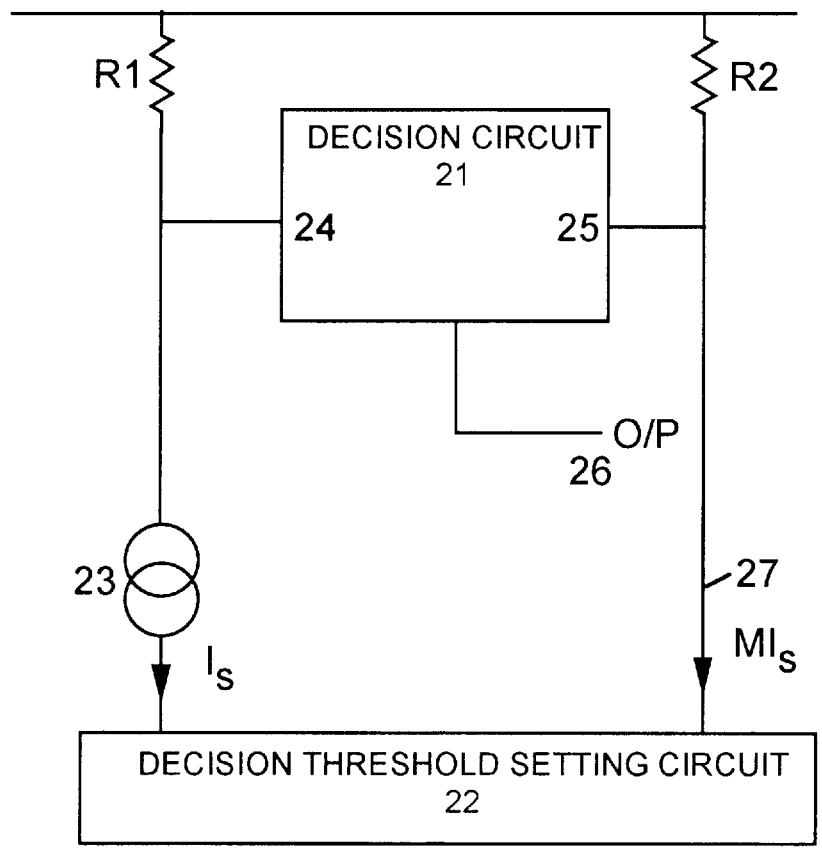
FIG. 2 is a schematic diagram of a system to perform the invention.

Referring to FIG. 2, there is shown a schematic diagram of a system to achieve the effect described above. A signal source 23 is coupled to a decision threshold setting circuit 22. The threshold setting circuit comprises a current mirror with an averaging function. The current mirror 22 takes the current $I_s$ developed by the signal source 23 and mirrors the average of the input current by a ratio M to draw a current $MI_s$ in a second arm 27. A decision circuit 21, the circuit that is responsible for comparing the input signal with a threshold, receives a data input 24 (i.e. a voltage developed by the signal source current) and a threshold input 25 (i.e. the voltage developed by the mirrored current $I_s$). Output 26 is the decision as to whether the input signal is above or below the adjusted threshold. As the average value of signal source $I_s$ varies so the value of $MI_s$ and hence the threshold level vary in sympathy.

Figure 3:
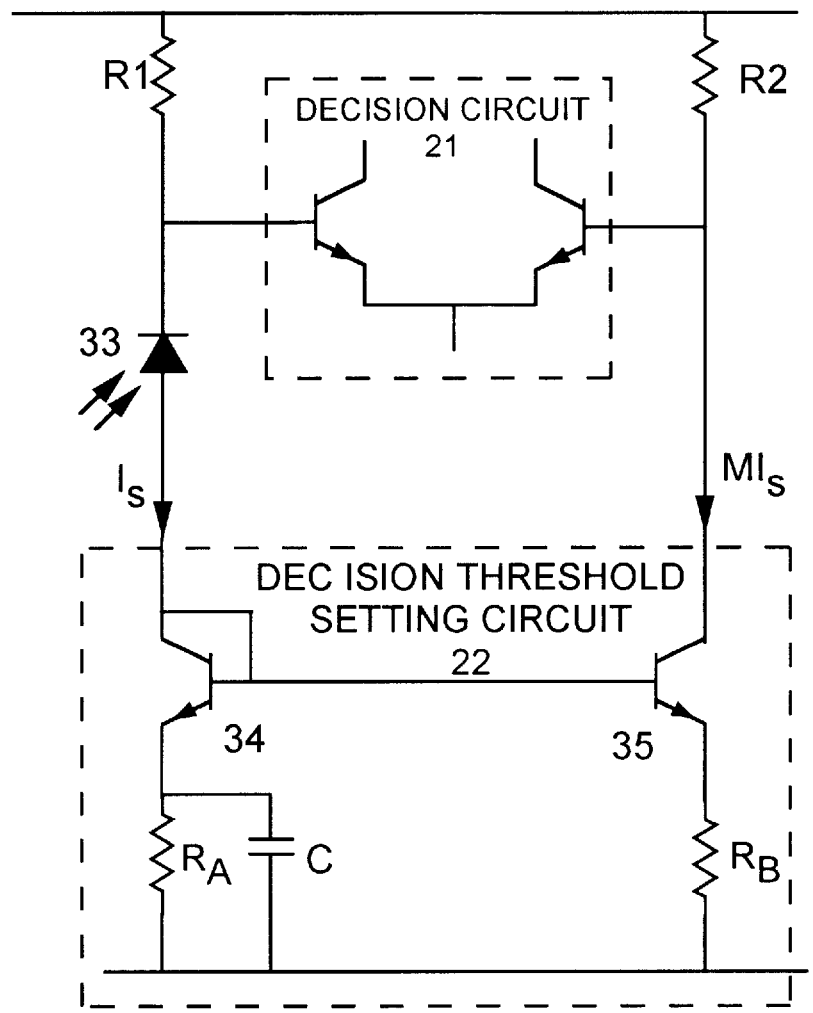
FIG. 3 is a diagram depicting one embodiment of the invention.

One application to which the system of FIG. 2 is well-suited is an optical receiver; FIG. 3 shows an embodiment of the invention adapted for an optical receiver. An optical signal is converted to an electrical one by photodiode 33 and the photodiode 33 either directly, or via a preamplifier, drives the decision circuit 21 and decision threshold setting circuit 22. Decision circuit 21 may be a comparator. Current $I_s$ generated by the photodiode flows through transistor 34 and is mirrored by a second transistor 35 to generate a current $MI_s$. The current ratio M is determined by $R_A/R_B$ as is known in the art. If M=1 and with R1=R2 the decision threshold is set at the same value as the average signal current, which for a digital signal will be 50% of the peak input signal. Similarly, with M=0.5 the decision threshold is set to 25% of the peak input signal. It will be appreciated that the threshold level may be set to any desired value by varying the value of the current ratio M. The threshold may be changed during operation by making one of resistors $R_A$ or $R_B$ variable. It will be appreciated that the decision threshold level may also be changed by varying the value of $R_2$. Other forms of current mirror 22 may be used in place of that shown in FIG. 3.

Capacitor $C_A$ placed in parallel with $R_A$ ensures that it is the average value of $I_s$ that is mirrored. Typically the time constant $(R_A \times C_A)$ would be set to a value tens or hundreds of thousands of times the duration of a bit interval to ensure that the average value of $I_s$ is mirrored. A capacitor $C_B$ may be placed in parallel with resistor $R_B$, with a value similar to $C_A$.

It will be appreciated that further decision thresholds can be easily generated by adding further transistors to the current mirror, each transistor coupled to an emitter resistor $(R_C, R_D \ldots)$, such that it mirrors a current determined by the ratio of the emitter resistances, e.g. $(R_A/R_C)$, $(R_A/R_D)$. Further capacitors $(C_C, C_D \ldots)$ may be placed in parallel with each of emitter resistors $(R_C, R_D \ldots)$.

Although the invention has been described for a current input signal source, a voltage source may be used by electronically transforming it into a current source, for example by use of a field effect transistor or a bipolar transistor operating in the common-base mode.

The system according to the invention may be suitably implemented on an integrated circuit.

The decision threshold setting circuit may be incorporated in an adaptive receiver to compensate for changes in signal levels due to component ageing, the current mirror providing an elegant alternative to the setting of thresholds and their associated circuitry conventionally employed in such receivers.

We claim:

1. A decision threshold setting circuit which receives an input digital signal and sets one or more decision thresholds for decoding the input digital signal, the circuit including means for generating a current corresponding to a time-average level of the input digital signal and means for mirroring said current to generate the decision thresholds, whereby to adjust each decision threshold to a level corresponding to a predetermined fraction of said current.

2. A decision threshold setting circuit as claimed in claim 1 wherein the predetermined fraction of the current is variable.

3. A decision threshold setting circuit as claimed in claim 1 wherein there are at least two decision thresholds.

4. A decision threshold setting circuit as claimed claim 1, wherein the means for mirroring is a current mirror comprising at least two base-coupled transistors.

5. A decision threshold setting circuit as claimed in claim 4 wherein the means for generating a current corresponding to the time-average level of the input signal is a parallel resistor and capacitor pair coupled to a transistor of the current mirror.

6. A digital communications system incorporating one or more decision threshold setting circuits as claimed in claim 1.

7. A method of setting decision thresholds comprising receiving an input digital signal, generating a current corresponding to a time-average level of the input signal and mirroring said current to generate one or more decision thresholds for decoding the input digital signal, whereby to adjust each decision threshold to a level corresponding to a predetermined fraction of said current.

* * * * *